United States Patent
Vaughan, Jr.

[11] Patent Number: 5,886,596
[45] Date of Patent: *Mar. 23, 1999

[54] RADIO FREQUENCY VOLUME COILS FOR IMAGING AND SPECTROSCOPY

[75] Inventor: John Thomas Vaughan, Jr., Lynnfield, Mass.

[73] Assignee: UAB Research Foundation, Birmingham, Ala.

[ * ] Notice: The term of this patent shall not extend beyond the expiration date of Pat. No. 5,557,247.

[21] Appl. No.: 710,365

[22] Filed: Sep. 16, 1996

Related U.S. Application Data

[63] Continuation-in-part of Ser. No. 526,135, Sep. 5, 1995, Pat. No. 5,557,247, which is a continuation of Ser. No. 103,940, Aug. 6, 1993, abandoned.

[51] Int. Cl.⁶ .............................. H01P 7/00; G01R 33/20
[52] U.S. Cl. ........................................ 333/219; 324/318
[58] Field of Search ................................ 333/219, 222, 333/227, 223, 226, 230–232; 324/318–322

[56] References Cited

U.S. PATENT DOCUMENTS

| | | | |
|---|---|---|---|
| 4,439,733 | 3/1984 | Hinshaw et al. | 324/322 |
| 4,504,788 | 3/1985 | Froncisz et al. | 324/316 |
| 4,602,234 | 7/1986 | Butson | 335/299 |
| 4,634,980 | 1/1987 | Misic et al. | 324/322 |
| 4,694,255 | 9/1987 | Hayes | 324/318 |
| 4,712,067 | 12/1987 | Roschmann et al. | 324/318 |
| 4,733,190 | 3/1988 | Dembinski | 333/219 X |
| 4,737,718 | 4/1988 | Kemner etal. | 324/322 |
| 4,746,866 | 5/1988 | Roschmann | 324/318 |
| 4,751,464 | 6/1988 | Bridges | 324/318 |
| 4,799,016 | 1/1989 | Rezvani | 324/318 |
| 4,820,985 | 4/1989 | Eash | 324/318 |
| 4,916,418 | 4/1990 | Rath | 333/219 |
| 4,949,044 | 8/1990 | Starewicz et al. | 324/320 |
| 4,952,878 | 8/1990 | Mens et al. | 324/322 |
| 4,980,641 | 12/1990 | Breneman et al. | 324/318 |
| 4,992,737 | 2/1991 | Schnur | 324/318 |
| 5,047,720 | 9/1991 | Guy | 324/320 |
| 5,055,853 | 10/1991 | Garnier | 343/769 |
| 5,277,183 | 1/1994 | Vij | 324/318 |
| 5,304,932 | 4/1994 | Carlson | 324/318 |
| 5,349,297 | 9/1994 | DeMeester et al. | 324/318 |
| 5,381,123 | 1/1995 | Laskaris et al. | 335/216 |
| 5,382,904 | 1/1995 | Pissanetzky | 324/319 |
| 5,530,355 | 6/1996 | Doty | 324/318 |
| 5,539,315 | 7/1996 | Cory et al. | 324/318 |
| 5,596,276 | 1/1997 | Nakagawa et al. | 324/316 X |

FOREIGN PATENT DOCUMENTS

| | | |
|---|---|---|
| 60-128339 | 7/1985 | Japan . |
| 4-364003 | 12/1992 | Japan . |

*Primary Examiner*—Seungsook Ham
*Attorney, Agent, or Firm*—Gifford, Krass, Groh, Sprinkle, Anderson & Citkowski, P.C.

[57] ABSTRACT

An electromagnetic shield for an NMR radio frequency coil designed to resonate at a selected Larmor frequency. The shield includes an electrically conductive layer surrounding the coil. This electrically conductive layer has a thickness substantially the same as one skin depth at the selected Larmor frequency. As such, the conductive layer efficiently conducts radio frequency currents at the selected Larmor frequency thereby conducting and containing the radio frequency coils at the selected Larmor frequency within the coil. Simultaneously, an electrically conductive layer, due to its thinness, very inefficiently conducts eddy currents of the type induced by the lower frequency DC gradient current switching transients the gradients are utilized to magnetically localize an image slice or volume. Consequently, the conductive layer simultaneously attenuates low frequency eddy current propagation of the type induced by the switching field gradient currents in the NMR application, and therefore does not substantially shield or effect the gradient fields across the coil.

6 Claims, 6 Drawing Sheets

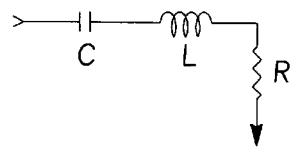
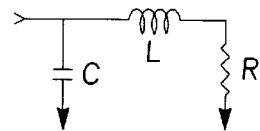
Fig-1a　　　　　　　　Fig-1b
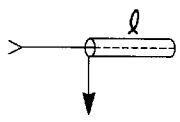
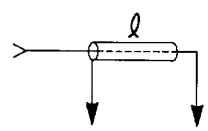
Fig-1c　　　　　　　　Fig-1d
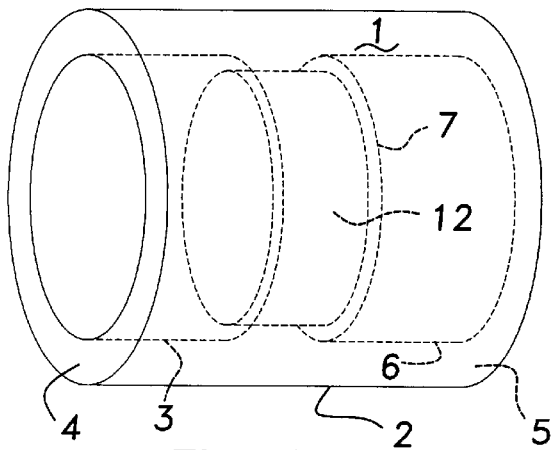
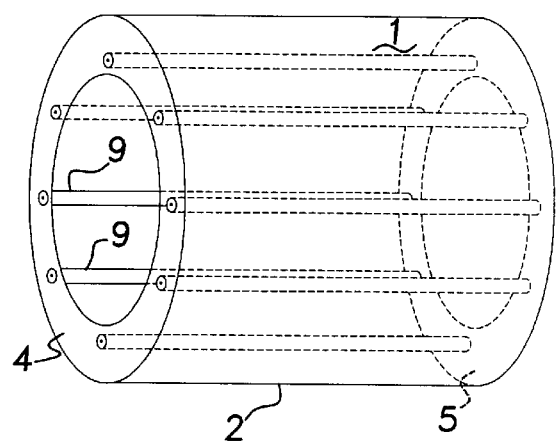
Fig-2a　　　　　　　　Fig-3a
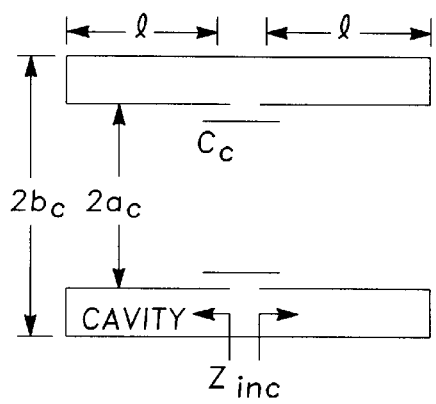
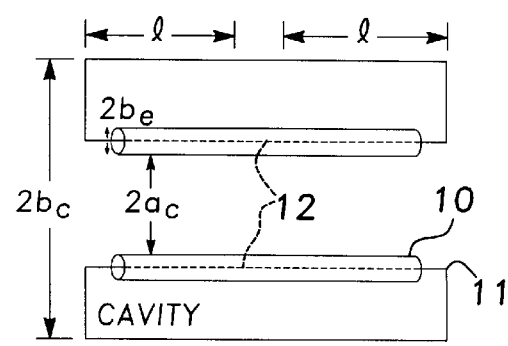
Fig-2b　　　　　　　　Fig-3b

M=0

M=1

M=2

M=3

M=4

RADIO FREQUENCY VOLUME COILS FOR IMAGING AND SPECTROSCOPY

CROSS-REFERENCE TO RELATED APPLICATIONS

This application is a continuation in part of U.S. Ser. No. 08/526,135, filed Sep. 5, 1995, now U.S. Pat. No. 5,557,247 which is a file wrapper continuation of U.S. Ser. No. 08/103,940 filed Aug. 6, 1993, now abandoned.

BACKGROUND OF THE INVENTION

The invention relates to extending the inherent signal-to-noise (S/N) advantage of high field MR to human imaging and spectroscopy, doing so by using a distributed circuit approach to designing RF volume coils, which approach wavelength dimensions. Performance of conventional lumped element designs succumbs to: 1) non uniform current distributions resulting in decreased homogeneity, decreased fill factor, and increased electric field losses, 2) decreased conductor skin depths resulting in decreased Q and increased ohmic losses, 3) self resonance below or too close to the desired frequency of operation and 4) increased electromagnetic radiative losses.

At higher frequencies the phase change due to finite propagation velocity of transmit and receive signals on coil conductors is no longer negligible. To preserve coil performance above 100 MHz, coil circuits must be distributed, and the distributed nature of the patient loaded coil must be considered.

More specifically in the present invention, lumped elements are replaced by transmission line and cavity elements, in the design of which lumped element circuit theory has been replaced by transmission line, i.e., transverse electromagnetic (TEM) theory. DC circuit and field analysis is replaced with fully time-dependent AC analysis for the coil and the human load. High frequency coils designed by the high frequency methods presented herein, have optimum desired $B_1$ field characteristics minimized coil losses and maximized self resonance. The inherent SIN advantage of high field MR is thereby realized in clinical images and spectra.

Lumped transmission line elements have been proposed heretofore for use in high frequency MR coil circuits. Thus, in 1976 Schneider and Dullenkopf proposed their slotted tube resonator probe head (1). More recently, Barfuss et al., used capacitively shortened, half wave slotted tube lines for 170 MHz (4 T) human body coils (2). Röschmann minimized the electric field loss problems of these resonator designs by replacing the unshielded, lumped element, slotted tube with a "tube" of half wave coaxial transmission line elements (3). The present invention provides further improvements of this transmission line (TEM) resonator in the form of variable tuning, double tuning, matching, and quadrature phasing (4, 5, 6).

In the previously known NMR coils, an RF shield was provided around the coil to stop or shield all signals at the radio frequency at which the RF coil resonates and to also pass unimpeded the switched DC gradient fields used to magnetically localize an image slice or volume.

In these previously known shields for NMR coils, such coils used a thick copper or conductive layer that retarded the switch gradient field induced eddy current by cutting or etching breaks or gaps in the conductive layer to interrupt or break up any eddy current flux path. This approach also interrupted the RF flux path making the shield inefficient or "leaky". Additionally, the gaps in these prior art shields allowed some RF to pass through the shield unshielded.

SUMMARY OF THE INVENTION

The present invention provides novel distributed element radio frequency (RF) coil design, capable of achieving large volume, distributed element coils for MR imaging, which as compared to prior art coils, have increased magnetic field homogeneity and fill factor, while minimizing E loss. They have more conductor surface which decreases resistance, and increases Q. Further, their self resonance is far above clinical coil frequencies, and electromagnetic losses are contained, and minimized, as well. Of course, a coil according to the invention also works well with lesser volumes, and lower frequencies.

A tunable TEM resonator according to the invention has a cavity and a set of transmission line segments which provide a high frequency magnetic field in the cavity. Circuitry including the distributed impedance of all the segments together determines the field frequency.

The resonator has an adjustment mechanism connected to the segments for adjusting the distributed impedances thereof at the same time. Each segment has a pair of members, such as the inner and outer conductors of coaxial cable, defining the distributed impedance of the segment.

One member of each pair is positionable with respect to the other member for setting each segment's distributed impedance, and is connected to the adjustment mechanism, which is operable to position, simultaneously, all the members which are connected to it.

The resonator can be constructed for selective operation at different field frequencies. More than one field frequency may be provided by having the resonator include two or more sets of adjustable impedance segments arranged about the volume within the cavity. In this case, the adjusting mechanism also provides for positioning all the positionable members of each set simultaneously, but preferably without affecting the positions of members of any other set.

A preferred form of segment is a length of coaxial transmission line, wherein the center conductor's length is interrupted intermediately, so that the circuitry, of which it forms part, incorporates it as a half-wave resonator balanced with respect to a virtual ground plane of the cavity.

Preferably, the circuitry for each set of segments includes a variable reactor connected to one of its segments for compensating for the effect of, say, a human body or body part on a field due to a set of segments. The set or sets of segments will have been tuned prior to using the resonator to image a subject.

In a double-tuned form of the invention the two tuning frequencies can be up to 500 MHz and higher, with the same cavity providing generally the same sensitivity to the contents there at both frequencies. High Q ratios, e.g., 800/80 for the human head can be attained along with high efficiency, e.g. 90°, 1kW/250 $\mu$sec square pulse, head optimization, and high homogeneity of field, e.g., 10% $\Delta B_1$, over 80% of the cavity inner diameter. At the same time, the coil operates at high power, e.g., 15 kW, with highly contained fields having minimal coupling to the exterior of the coil, making the coil ideal for combinations with close fitting magnet gradient coils, or other RF coils.

The particularized object of this invention is to provide a tunable TEM resonator, which is both singly and/or multiply-tunable; variably tuned, matched, and quadrature phase optimized; and useful for circularly polarized volume coil constructions, as in medical and scientific applications for MR imaging, or spectral analysis.

Another object of the invention is to provide a TEM resonator for operation at more than one frequency.

Another object of the invention is to provide a TEM resonator which can be tuned to one or other of several frequencies.

Another particular object of the invention is to provide a TEM resonator having a plurality of sets of distributed impedance elements, wherein each such set tunes the resonator to a corresponding frequency, substantially without affecting the tuning thereof at any other frequency. Again, it is a particular object of the invention to provide a TEM resonator tuned to each of two frequencies, at either of which it is operable substantially independently of its tuning for the other.

It is also a particular object of the invention to provide a TEM resonator having two sets of distributed resonance elements, one set being arranged to provide for operation at a first frequency, and the other set being arranged to provide for operation at a second frequency, but substantially without either set affecting operation of the other.

The present invention also provides an electromagnetic shield for NMR radio frequency coil having an electrically conductive layer surrounding the coil. This conductive layer preferably has a thickness of about one skin depth of the selected Larmor frequency for the coil such that the conductive layer, via the skin effect, efficiently conducts radio frequency currents and contains these radio frequency currents within the coil. Simultaneously, the conductive layer attenuates low frequency eddy current propagation of the type induced by switching gradient currents in an NMR application of the type used to magnetically localize an image slice or volume.

BRIEF DESCRIPTION OF THE DRAWINGS

FIGS. 1*a, b, c, d* compare lumped element resonant circuits to transmission line analogues.

FIGS. 2*a, b* diagrammatically illustrate a coaxial cavity used for high frequency volume MR coils according to the invention.

FIGS. 3*a, b* diagrammatically illustrate a tuned TEM resonator according to the invention.

DETAILED DESCRIPTION OF THE INVENTION

Figure 4:
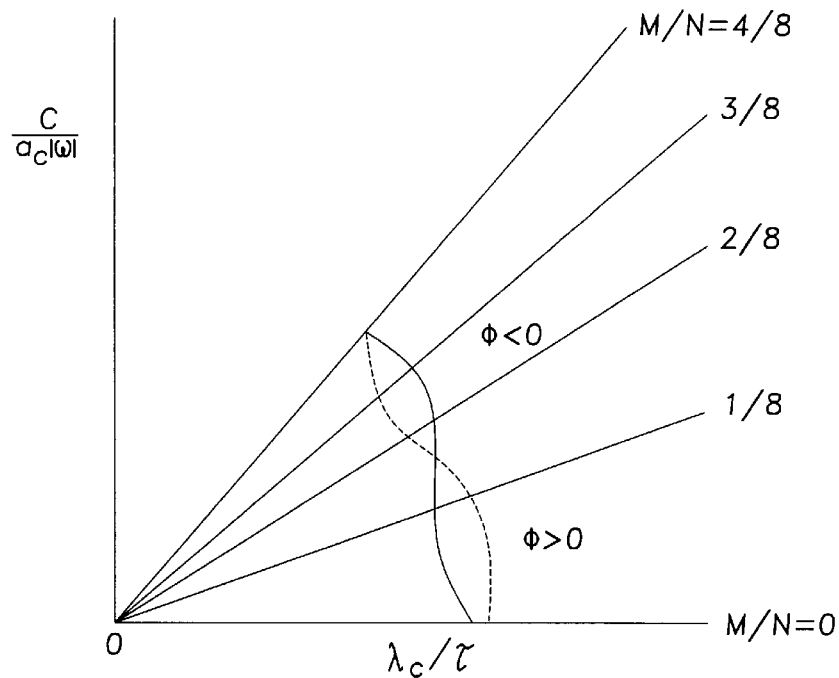
FIG. 4 is a diagram of the modes of an eight element TEM resonator.
Figure 5A:
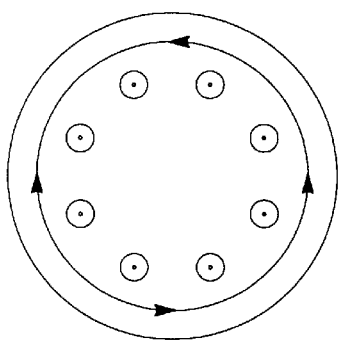
FIGS. 5*a, b, c, d, e* show $B_1$ flux line representations for the five modes of an eight element TEM resonator, according to the invention.
Figure 5B:
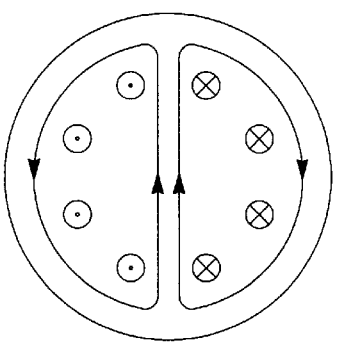
Figure 5C:
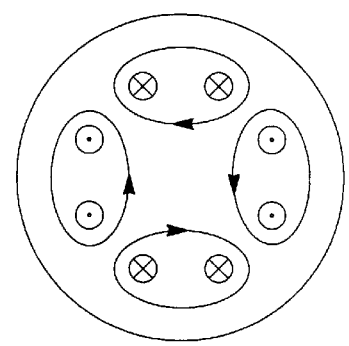
Figure 5D:
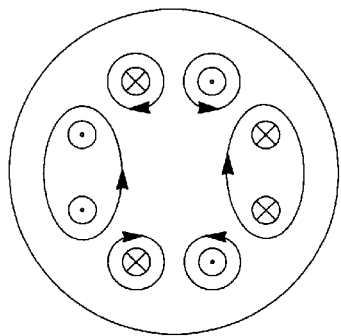
Figure 5E:
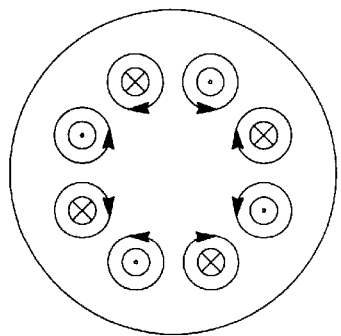

The tuned TEM resonator of the present invention is exemplified by a transmission line tuned coaxial cavity resonant in a TEM mode. The coaxial line tuning elements correspond to the "slotted" hollow center conductor of this coaxial cavity.

In FIGS. 2*a* and 2*b*, the TEM cavity volume coil is shown in the form of a reentrant cavity 1 such as is used for klystrons and microwave triodes (8). The cavity is reentrant in that its conductive boundaries 2, 3, 4, 5 and 6 extend into or reenter the volume encompassed by the cavity. Using transmission line theory, approximations of the distributed impedance coefficients R, L, C, the fundamental TEM mode resonant frequency, and the resonant Q of this cavity are made. The coaxial cavity is similar to a coaxial line shorted at two ends and joined in the center by a ring capacitor $C_c$, and having the dimensions $$\text{o.d.}=2b_c,\ \text{i.d.}=2a_c\ \text{length} \approx 2l.$$

The input impedance to each low loss, shorted coaxial half cavity is given by $$Z_{in}=Z_0 \tanh(\alpha+j\beta)l \qquad (1)$$

The characteristic impedance for this coaxial cavity is derived from Eq. (2).

$$Z_0=\sqrt{L/C}=(\eta/2\pi)(ln\,b/a)\ \text{for}\ \eta=\sqrt{(\mu/\epsilon)} \qquad (2)$$

For a coaxial cavity whose outside radius is $b_c$ and whose inside radius is $a_c$, $$Z_{0c}=(\eta_0/2\pi)ln(b_c/a_c) \qquad (3)$$

$$Z_{inc}=Z_{0c}\tanh(\alpha_c+j\beta_c)l,\ \alpha_c \approx R_c/2Z_{0c} \qquad (4)$$

for α=0, $$Z_{inc}=Z_0\tan\beta_c l \qquad (5)$$

For $Z_{inc}=X_{inc}$ Eq. (12), the distributed inductance $L_c$ of the low loss cavity is:

$$L_c=2X_{inc}/\omega=2Z_{0c}\tanh(\alpha_c+j\beta_c)l/\omega \qquad (6)$$

For the low loss coaxial cavity, $$L_c=2Z_{0c}\tan(\beta_0 l)/\omega \approx 2Z_{0c}l/v_0 \qquad (7)$$

Compared to a lumped element coil circuit enclosing a given volume, the inductance $L_c$ of the coaxial cavity containing the same volume is significantly lower. The center gap series capacitance $C_c$ required to resonate this cavity at the design frequency $f=\omega/2\pi$ is:

$$C_c=1/2\omega X_{ic}=1/2\omega(Z_0\tanh(\alpha_c+j\beta_c)l) \qquad (8)$$

And for the low loss approximation, $$C_c=1/(2\omega Z_0\tan\beta_0 l) \quad (9)$$

This center conductor gap capacitance could be supplied in lumped elements or by a capacitive ring 7 as pictured in FIGS. 2a and 2b. Stray capacitance $C_s$ between the inner and outer walls of the coaxial cavity contributes a small fraction of the value $C_c$. $C_s$ ultimately limits the cavity's self resonance frequency which is substantially higher than that of the lumped element coil of the same volume; a cavity of human head coil size will resonate above 500 MHz, for example. The stray capacitance for the lossless coaxial cavity is approximated by, $$C_s=\pi\epsilon l/ln(a/b) \quad (10)$$

The fundamental TEM mode resonant frequency $f_0$ of the cavity given by Eqs. (9, 10) is:

$$f_0=1/(2\pi\sqrt{(L_cC_c)}) \quad (11)$$

The series conductor resistance $R_c$ in the cavity is determined by the frequency dependent surface resistance $R_s$:

$$R_c=(R_s/2\pi_c)(1/a_c+1/b_c)2l,$$

where $$R_s=\sqrt{(\omega\mu_0/2\sigma)}=1/\sigma\partial \quad (12)$$

Shallow skin depth δ of current flux in a good conductor σ=δ(10⁷), S/m makes for the requirement of a large surface area of cavities for minimizing R. The skin depth, δ, of copper at 100 MHz, for example, is 0.0066 mm.

$$\delta=1/\sqrt{(\pi f\mu\sigma)} \quad (13)$$

The small, high frequency skin depth dimension however allows the use of very thin foil or surface deposited conductors which adequately conduct (and contain) RF currents and fields, but effectively attenuate low frequency eddy current propagation as induced by switching $B_0$ field gradient currents in the MR application. The characteristically high resonant $Q_{rc}$ of the cavity is:

$$Q_{rc}=\beta_c 2/\alpha_c=2\pi f_0 L_c/R_c=2\pi f_0 Z_0/R_{c-c} \quad (14)$$

Although the optimum TEM mode Q occurring for the b/a ratio of 3.6 is not readily achievable in head and body coil applications in the meter bore magnet, practical coil dimensions allow for unloaded Q values in excess of 1000. The advantageous properties of decreased inductance, decreased resistance, increased frequency, high Q, and self shielding for the coaxial cavity should now be clear. As pointed out, the cavity of the present invention makes for an effective shield as well.

The shield of the present invention is designed such that the conductive layer 23 (FIG. 9) surrounding the NMR coil has a thickness such that the conductive layer conducts RF current near the surface of the layer via the skin effect. As such, the thickness of the conductive layer is preferably about one skin depth at the selected Larmor frequency, i.e., the depth below the surface at which the current density has decreased one neper below the current density at the surface. This is defined as a decrease in the field to 1/ε (36.8%) of its surface value.

By selecting a conductive layer having a thickness equal to one skin depth, the conductive layer efficiently conducts the radio frequency at the selected Larmor frequency thus efficiently containing radio frequency fields within the interior of the shield. Simultaneously, a thin conductive layer conducts the much lower frequency fields of the type induced by switching field grading currents or switched DC transients very inefficiently. Consequently, such relatively low frequency switched DC gradient fields pass essentially unimpeded through the conductive layer or shield.

The electrically conductive layer preferably comprises a metal foil having a continuous surface. The layer may be a deposited metallic layer or a plated metal layer.

Thus, for a conductive layer of at least one skin depth thickness at the selected Larmor frequency, an RF current flows efficiently through the conductive layer. When an RF electromagnetic signal, i.e. from the coil, impinges upon the conductive layer, a counter current or "shielding" current is induced in the conductive layer. The counter current in the conductive layer projects an opposing EM field which, when superimposed within the source field, creates field cancellation. The external RF signal is thereby effectively canceled or shielded at the conductive layer as desired.

Conversely, when a DC magnetic field gradient is switched, the switched gradient field transient induces momentarily an opposing or shielding current to flow in a nearby conductor. If this conductor, however, is thin enough, much thinner than the skin depth of the higher frequency components of the gradient transient signal, then the switched gradient induced shielding currents or eddy currents will be retarded and the switched gradient field will pass through the RF shield unimpeded as desired.

Consequently, by utilizing the skin effect phenomena at the RF frequency and selecting a conductive layer or "skin" having a thickness sufficient to efficiently conduct the radio frequency currents and contain the radio frequency fields within the coil and simultaneously attenuate low frequency eddy propagation current of the type induced by switched DC gradient fields, the shield or conductive layer is effectively opaque to RF fields and translucent to gradient fields. Furthermore, all of this is achieved without the previously known practice of providing slots or openings within the shield which renders the shield RF inefficient or "leaky". Furthermore, since the conductive layer of the present invention is provided continuously around the coil without gaps or slots, the previously known RF leakage through the slots or gaps is effectively eliminated.

To permit TEM mode magnetic field propagation in the utility center of the coaxial cavity, the hollow center conductor (reentrant wall with capacitive cylinder), must be slotted (1, 2). Unshielded lumped element capacitors or capacitive plates bridging the cavity's slotted center conductor "leak" to the conservative electric (E) field largely stored within these capacitors. Problematic stray E fields, however, which adversely affect the coil's tune, match, and phase stability as well as efficiency, can be better contained by using N coaxial line elements as tubular, shielded capacitors 9 (3), as in FIG. 3b. The conservative E field for the resulting TEM resonant cavity is thus largely contained within the dielectric regions between the floating outer conductors 10 of the coaxial elements, and the reentrant center conductors 11 which are interrupted or split at 12, but are otherwise continuous with the cavity 1. (FIG. 3b) The coaxial tuning element used is similar to a pair of open ended coaxial lines joined in the center by a continuous outer conductor.

For the fundamental TEM mode resonance, each mirrored pair coaxial element is in balanced series resonance with the cavity. The current waveform peak amplitude is centered on these balanced elements, and effects a transverse virtual ground plane which bisects the tuned cavity. A desired transverse $B_1$ field maximum and an E field minimum are thereby generated within the cavity center as desired.

The TEM cavity resonator is tuned to the design frequency by adjusting the reactance (both L and C) of the line elements 9. Gross adjustment is managed by dimensional design of the elements and the cavity. Fine tuning is performed by manipulating the center conductor gaps in the elements, i.e. positioning the center conductors to appropriate insertion depths.

The transmission line element tuned coaxial cavity according to the invention is the basis for high frequency, large dimensioned volume coils for MR applications, and can be briefly characterized as a "tuned TEM resonator".

Transmission line theory (7) provides the design equations for the TEM resonator. The input impedance to each open coaxial half element is given by Eq. (15)

$$Z_{in} = Z_0 \coth(\alpha + j\beta)l \qquad (15)$$

and its characteristic impedance is derived from Eq. (2). For the input impedance $Z_{in} = X_{ine}$ and characteristic impedance $Z_0 = Z_{0e}$, the distributed capacitance $C_e$ for each of the coaxial tuning elements is:

$$C_e \approx 1/2\omega X_{ine} = 1/(2\omega Z_{0e} \coth(\alpha_e + j\beta_e)l) \qquad (16)$$

The distributed capacitance of a series pair of lossless open line segments is easily calculated using $jZ_0\cot\beta l$ for approximating $C_e$.

$$C_e = \tan\beta_e l/2\omega Z_{0e} \approx l/2Z_{0e}l) = \pi \epsilon_e l/\ln(b_e/a_e) \qquad (17)$$

A coaxial tuning element of the cavity length $2l$, FIG. 3b, is constructed for a desired $Ce$ by choosing the appropriate dimensions for the center conductor radius $a_e$ and the outer conductor radius $b_e$. The dielectric material for the elements is typically not air, therefore $\epsilon_e = \epsilon_r \epsilon_0$ where the relative permativity for commonly used Teflon is $\epsilon_r = 2$. The distributed inductance $L_e$ for each coaxial element can be similarly derived from Eq. (15) for $L_e = 2X_{ine}/\omega$, and approximated by:

$$L_e \approx (Z_{0e} 2l_e/v) = Z_{0e}\sqrt{(\mu_0 \epsilon_e)} 2l \qquad (18)$$

From Eq. (12), the resistance $R_e$ per element is:

$$R_e = ((l/\partial\sigma)/2\pi)(1/a_e + 1/b_e)2l \qquad (19)$$

The total series inductance $L_t$, capacitance $C_t$, and resistance $R_t$, for an N element tuned TEM resonator are:

$$L_t \approx L_c + L_e/N \qquad (20)$$

$$C_t \approx NC_e \qquad (21)$$

$$R_t \approx R_c + R_e/N \qquad (22)$$

Resonant frequencies are:

$$f_r = \omega_r/2\pi = \beta v/2\pi = nv/4l = n/(4l\sqrt{(LC)}), \ n = \text{integer} \qquad (23)$$

In the approximations for L and C above, small amounts of mutual inductance and stray capacitance in the TEM resonator structure were not considered. By Eqs. (20, 21, and 23) the TEM mode resonance for the tuned TEM resonator is:

$$f_{0t} \approx 1/(2\pi\sqrt{(L_t C_t)}) \qquad (24)$$

The Q factor for the TEM resonator is:

$$Q_t \approx 2\pi f_0 L_t/R_t \qquad (25)$$

When coupled inductively or capacitively to a matched transceiver network, the quality factor becomes Q/2 for the circuit loaded TEM resonator.

TEM resonator modes: The tuned TEM resonator is a closed-ring periodic delay line similar to a traveling-wave magnetron oscillator (9). In the traveling wave type oscillation, the mode M dependent phase difference $\phi_M$ between the electrical oscillations of N successive tuning elements is such to produce a rotating AC field or traveling wave periodic with $\tau_M$ in the interaction space between the elements and the cavity of the resonator.

$$\phi_M = 2\pi M/N = \beta_0 \tau_M \qquad (26)$$

The traveling wave propagates in the azimuthal direction at an angular phase velocity $\omega_M$ for the fundamental harmonic of mode M and phase constant $\beta_0$ where angular phase velocity $\omega_M$ equals the resonant or eigen frequency of the corresponding mode.

$$\pm\omega_M = \pm\beta_0 d\phi/dt \qquad (27)$$

In the pass-band of the resonator, $\pm\phi<\pi$, therefore from Eq. (27), $0 \leq M \leq N/2$ for the integer M. (N/2+1) resonant modes are possible in the tuned TEM resonator.

$$M = N\phi_M/2\pi \qquad (28)$$

The fundamental modes and corresponding resonant frequencies of the eight element tuned TEM resonator are graphically described in FIG. 4. The ordinate y is the unitless "retardation" ratio of the free space propagation velocity to the "slow-wave" angular velocity of the closed delay line resonator of radius a.

$$y = c/l\omega = M\lambda_0/2\pi a = M\lambda_0/N\tau \qquad (29)$$

The abscissa is the ratio of the free space wavelength $\lambda_0$ to the modal period $\tau_M = 2\pi a/M$ for the resonator. The curves $y = f_0(\lambda/\tau)$ for constant M/N are constant lines through the origin. The frequencies of the different fundamental modes are determined by the intersections of these constant mode lines with the dispersion curve:

$$c/a\omega = f(\lambda_0/t) \qquad (30)$$

Because the angular phase velocity $\omega$ has positive and negative components (traveling waves propagate in two directions around the closed-ring resonator), separate dispersion curves of positive and negative phase $\phi$ may exist resulting in more possible frequencies for the tuned TEM resonator, N in total.

The lowest frequency corresponding to M=0 (the cyclotron frequency mode) is the self resonance of the tuned TEM resonator Eq. (24). For this frequency with all tuning elements oscillating in phase, $\phi=0°$. The highest frequency and upper boundary for the fundamental modes corresponds to M=N/2, the $\pi$ mode. In this mode all tuning elements are in phase opposition with adjacent elements, $\phi=\pm180°$. A single frequency standing wave results.

The remaining (N/2−1) modes of resonance are degenerate doublets for imperfect TEM resonator symmetries. A slight departure from circular symmetry in the resonator will cause ±dispersion curve separation resulting in degenerate mode splitting. The azimuthal current distribution as a function of $\phi$ in the resonator elements can be generalized for an imperfect coil as a Fourier series of positive phase (co-rotating) and negative phase (counter-rotating) traveling waves of unequal amplitude and phase, $$I=\Sigma_1^\infty(A_M\cos(\omega t-M\phi+\delta)+B_M\cos(\omega t+M\phi+\xi)) \quad (31)$$

where $\delta$ and $\xi$ are arbitrary phase constants. For perfect circular symmetry where A=B, and $\delta=\xi$, the doublets converge to a single frequency for each respective mode. As coupling between the tuning elements decreases, the modal resonances converge toward a single frequency approximated by Eq. (24).

Mode M=1 corresponding to $\phi=2\pi/N$ is the TEM mode of choice for the clinical MR application. This mode produces a transverse $B_1$ field whose maximum magnitude and homogeneity are coincident with the central transverse virtual ground plane of the tuned TEM volume coil. The $2\pi/N$ mode can be driven in quadrature for improved MR coil transmission and reception efficiency. This M=1 mode is closest to the single cyclotron mode (M=0), and is easily identified in non optimized coils as the lowest frequency split resonance.

According to the invention, if only eight elements of the resonator are tuned for a given frequency, the other eight are tuned for a different frequency, i.e. the TEM resonator can be double tuned by tuning even and odd elements respectively to two widely different frequencies (6). Two resonance groups then result of (N/4+1) modes each. Each resonance group consists of 2 single resonances separated by (N/4+1) degenerate double resonances.

The second mode of each group generates the desired transverse $B_1$ field for the MR application. The double tuned TEM resonator so described is similar to the "rising-sun" magnetron oscillator (9).

PREFERRED EMBODIMENTS OF THE INVENTION

Figure 9:
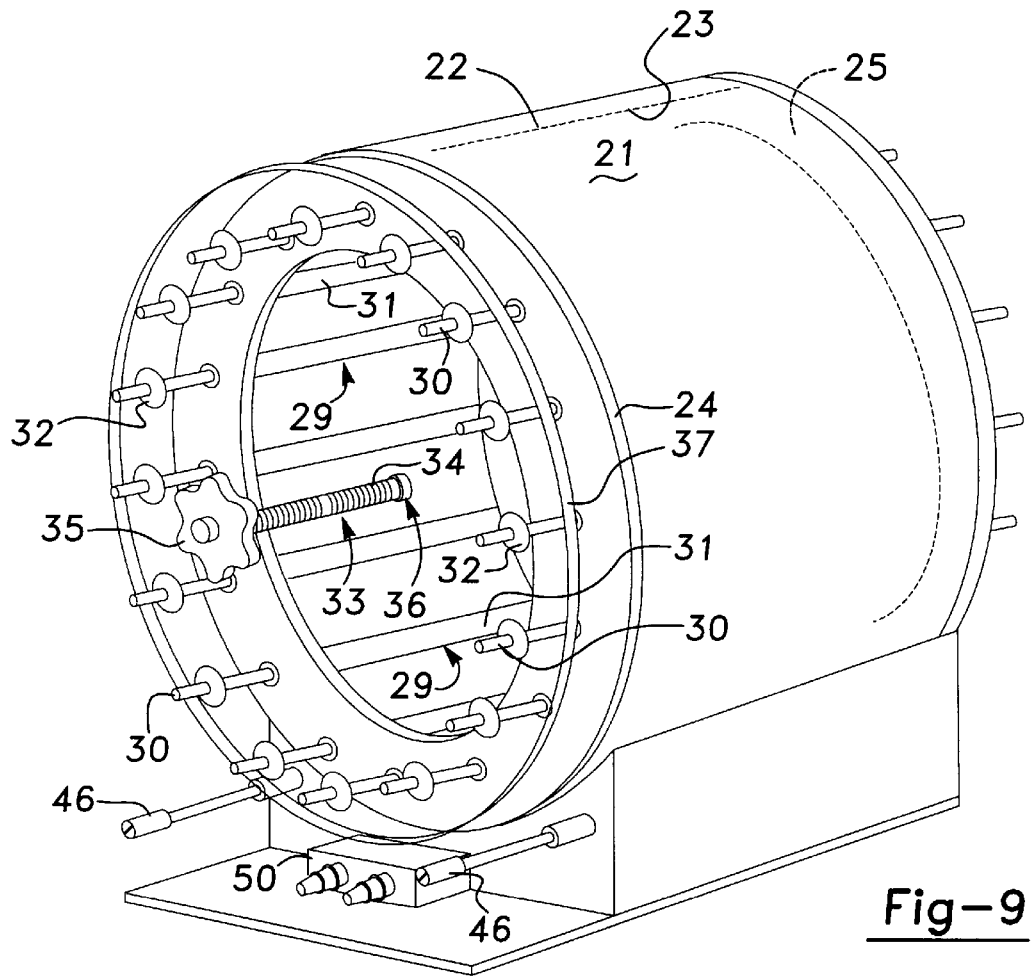
FIG. 9 is an elevation, in perspective, of a tuned TEM resonator for a high frequency, large volume MR coil, according to the invention.
Figure 12:
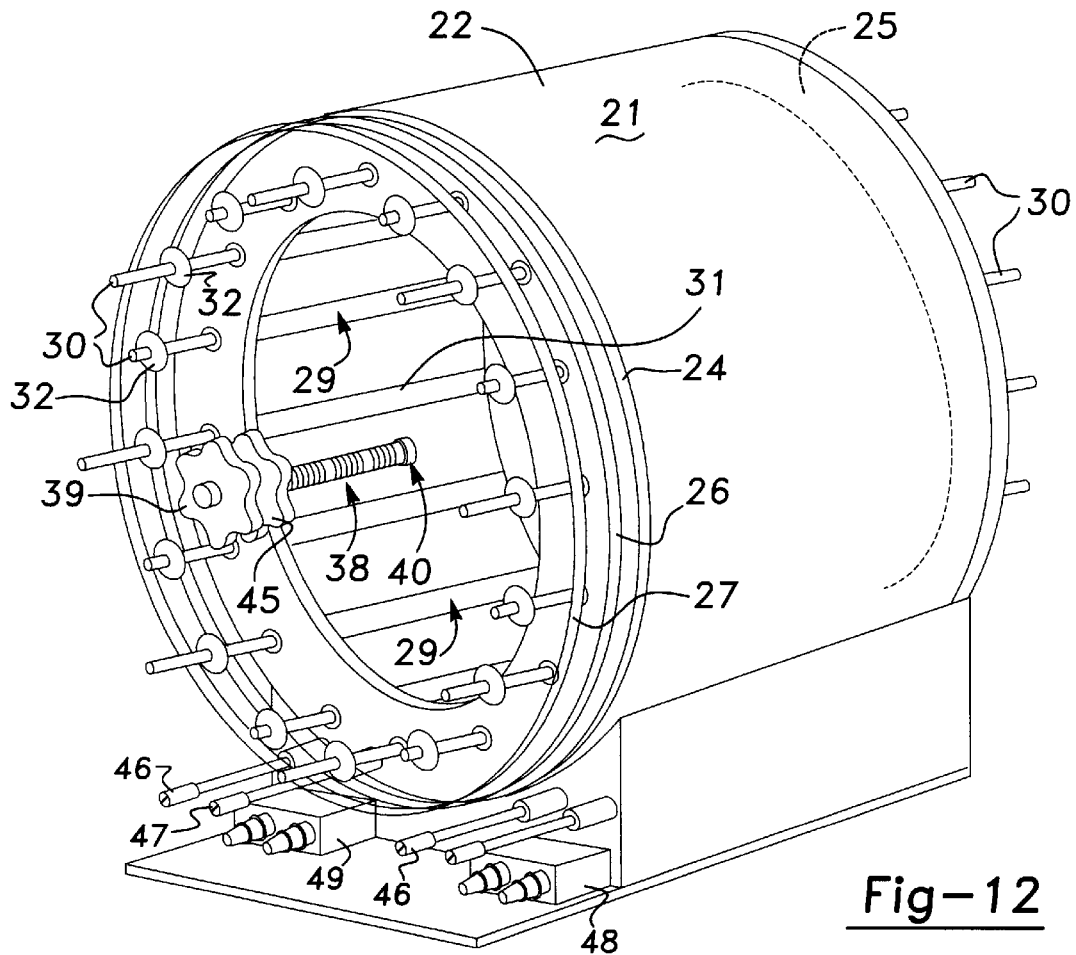
FIG. 12 is an elevation, in perspective, of a dual frequency tunable TEM resonator for a high frequency, large volume MR coil, according to the invention.

These are shown in FIGS. 9 and 12. Since FIG. 12 in effect contains FIG. 9, the following description of my invention will be mainly in terms of FIG. 12.

According to my invention, the same coil structure can allow operation at two or more frequencies. For example, the FIG. 9 coil can provide fields at either of the commonly used values 70 MHz and 178 MHz. That is, while the 16 elements of FIG. 9, as a single set, can be tuned so that the coil can operate well at any single frequency in the corresponding range, e.g., (70–200)MHz, the elements can also be tuned so that the coil can operate well at either of 71 MHz and 175 MHz, or other frequency pair in that range. Thus, 8 of the 16 elements, preferably, every other one, can be adjusted to provide operation at 71 MHz, and the remaining 8 can be adjusted to provide operation 175 MHz. Such adjustments do not interact, because no element of one set is closely enough coupled to an element of the other set, that adjustment of the impedance of an element of the said one set, can significantly effect impedance in the said other set.

Of course, in providing multiple frequency operation, it is necessary to provide different values for other parameters, such as $B_1$. However, the coil of my invention can accommodate such different values by having corresponding sets of elements, which sets, once tuned, provide the desired frequencies without further adjustment of any elements, and without alteration of the physical configuration of the coil itself. In effect, then the coil of my invention is as many coils as there are frequencies for which the elements of my coil are tuned.

As will be seen from FIG. 12, my multiple tuned TEM resonator design, like the single frequency form of FIG. 9, uses 16 elements. However, these are divided into two groups of 8, each of which is mounted for adjustment independent of the other, by adjusting mechanism shortly to be described.

In practice, each group is tuned to some desired frequency by appropriately varying the depths of insertion of the center conductors, thereby fixing the elements' distributed impedances.

In use, one set or the other provides the desired field, and if necessary, is fine-tuned, just as if only 8 of its 16 elements are present. More generally, if there are n elements in all, then m thereof can form a set, thereby leaving (n-m) elements from which to form one or more additional sets.

Indeed, one will be able, in general, to provide k tunings, where k, the number of sets can be greater than 2.

Turning to FIG. 12, cavity 21, corresponding to cavity 1, FIG. 3a, is essentially a plastic cylinder 22 having a circular plate 24 and an end ring 25 fixed thereto, these three elements being provided with a conductive foil on its inside, so as to provide the conductive cavity configuration indicated in FIGS. 3a and 3b. Ring 24 allows a body member, such as the human head, to be inserted into the cavity.

Like cavity (and shield) 1, the cavity (and shield) 21 is provided with transmission line elements 29, like elements 9, but being 16 in number. In order to provide more than one tunable frequency, two, say, for simplifying illustration of the present invention, a pair of circular non-conductive plastic plates 26 and 27 have the center conductors 30 of the elements 29 affixed thereto. In this case, every other conductor 30 is affixed to just one plate. Thus, plate 26 is affixed to the center conductor 30 of a set of elements 29 corresponding to frequency A, and plate 27 is affixed to the center conductors of the remaining elements 29, which correspond to frequency B. The outer conductors 31 of all 16 elements 29 are fixed to plate 24 and end ring 25, and are electrically continuous with the metal foil on cylinder 22, plate 24, and end ring 25.

The conductors 30 are fixed in position by collet clamps 32, which releasably secure the center conductors 30. Clamps 32 themselves are fixed in place, as by being embedded in the respective plates, which are shown as transparent, though they could as well be opaque.

It will be evident that during resonator assembly, the depth of insertion of conductors 30 in the segments 29 can be set by loosening the collet clamps, then individually adjusting the depths of insertion of conductors 30 until by actual measurement a resonant condition exists when RF energy of the desired frequency is used to energize the coil. This tuning is coarse, but at this point, the collet clamps are set to fix the depth of insertion of conductors 30. However, plate 27 can be translated along its axis (which is also the axis of cavity 21), in order to move all 8 conductors simultaneously, so as to vary their depth of insertion, by equal amounts.

(This may be taken as a description of the construction and operation of the single frequency resonator of FIG. 9. That is to say, in FIG. 9, the only difference is that the 16 center conductors 30 have their depths of insertion adjusted, just as in FIG. 12, 8 conductors are so adjusted, in order to tune to the desired frequency.)

The remaining 8 center conductors in FIG. 12 are fixed to the plate 27 by collets 32, at their outer conductors 31. As with their 8 fellows, their depths of insertion are adjusted also, but so as to tune the coil to a different desired frequency. As before, collet clamps 32 releasably fix the conductors 30 in a circular plate 27 again of transparent plastic. Like plate 26, plate 27 can be translated along the cavity axis, thereby to vary the depths of insertion of the corresponding 8 conductors simultaneously, and by equal amounts.

Various mechanical movements can be used for translating the plates 26 and 27, and indeed they can be moved directly by hand since the conductors 30 can have something of a friction fit in the dielectric of the elements, and in any event, the plates can be clamped in place by obvious means, not shown.

Preferably, I provide a simple screw mechanism, which acts colinearly of the plates' axis. Due to the symmetry of the arrangement, the plates cannot cock, and screw threading inherently provides clamping.

In FIG. 9, such screw mechanism 33 is just that: a screw 34. The screw 34 has its outer end terminated by a knob 35 for turning it, and has its inner end journaled at 36 in plate 24. The journal 36 may be any suitable hardware rotatably securing the end of screw 34 in plate 24, so that when knob 35 is turned, the screw 34 will rotate but will be prevented from translating along the coil axis.

Screw 34 passes through plate 37, which corresponds to plate 26, via a threaded bore (not shown) in the plate, the bore being coaxial with the coil axis. Turning knob 35 therefore causes the plate 37 to translate along the coil axis, whereby to adjust the central conductors' position simultaneously and by equal amounts.

In FIG. 12, a somewhat more complex screw mechanism 38 is provided. Mechanism 38 has a knob 39, corresponding to knob 35, in that turning it translates plate 26, but as will be seen later differs somewhat, structurally, from screw 33, though otherwise performing the same tuning function.

Corresponding to journal 36, mechanism 38 has journal 40 rotatably securing it to plate 24. Screw mechanism 38 is also threaded to plate 27 for translating it along the cavity axis.

Figure 13:
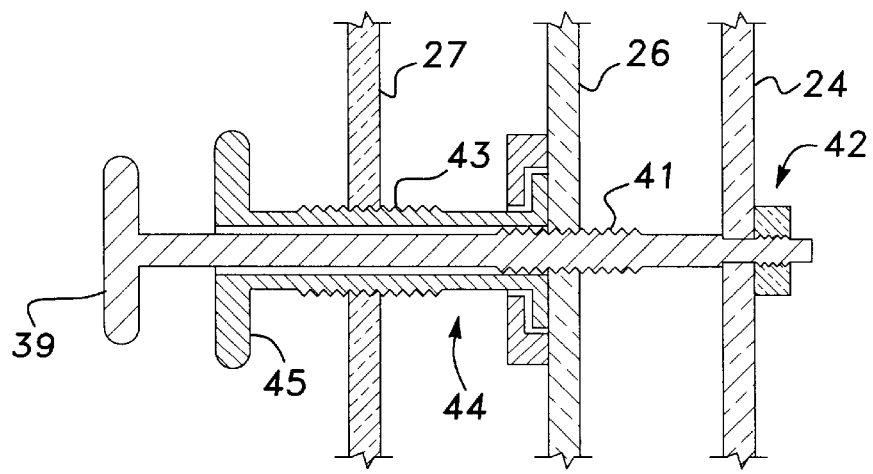
FIG. 13 is a sectional view of a portion of FIG. 12.

FIG. 13 shows screw mechanism 38 in longitudinal section. Thus, corresponding to screw 34 and journal 40 of FIG. 9, in FIG. 13, a screw 41, terminating in the knob 39 at one end is journaled in plate 24 for rotation, without translation along the axis of plate 24. As shown, screw 41 is threaded into plate 26. A sleeve screw 43, in which screw 41 freely rotates has at one end a journaled portion 44 securing it to plate 26 for rotation without translation when knob 45, which terminates the other end of sleeve screw 43, is turned. The sleeve screw 43 is threaded to plate 27, so rotation of the knob 45 therefore causes plate 27 to translate along the axis of cavity 21.

In use, one first tunes the elements 29 whose center conductors are clamped in the collets of plate 26. Then one turns the other elements whose center conductors are clamped in the collets of plate 27. Since there is negligible coupling among the elements, neither turning affects the other.

The tuning features described above contemplate that, at the other ends of the transmission line segments, the initial depth of insertion of the corresponding center conductors, established in assembling the cavity, will not be changed in subsequent use. (The ring 25 will, of course, support the other outer ends of the elements 29, like the ring 24 does.) Additional tuning effect could be had by varying the depth of center conductor insertion at the other ends of the elements 29. This could be managed by an arrangement of rings corresponding to plates 26 and 27, which would serve to bodily adjust such depth of insertion, as do the plates 26 and 27. Note that one end of the cavity needs to be open for insertion of a body or body member.

In sum, then, one set or the other provides the desired field, and if necessary, is fine-tuned just as if only 8 of its 16 elements is present. More generally, if there are n elements in all, then m thereof can form a set, thereby leaving (n-m) elements from which to form one or more additional sets.

Indeed, one will be able, in general, to provide k tunings, whereby k, the number of sets, can be greater than 2.

The same approach allows the coil to be multiply tuned, in general, i.e., to three or more resonances.

TEM resonator $B_1$ fields: The free space magnetic vector potential contours (flux lines) for the five modes of the eight element TEM resonator are schematized in FIGS. 5a–5e. The mode M=1 is the obvious choice for efficient, homogeneous magnetic coupling to a central region of interest. Such free space AC fields are often approximated by the DC field Biot-Savart law. At radio frequencies beginning at about 100 MHz however, static field approximations of RF fields in human anatomy are no longer accurate. Similarly, simple homogeneous, isotropic geometries (spheres and cylinders) are not appropriate for modeling the human load.

Viewing the human body as a heterogeneous, lossy dielectric of tissue wavelength proportions, the electromagnetic propagation boundary effects of refraction, reflection and attenuation must be considered. Substantial axial eddy current shielding and orthogonal displacement current extension of the $B_1$ field are observed in human tissues at high frequencies. Fully time-dependent equations and complex numerical models are required for describing the high frequency coil $B_1$ field distribution in anatomic regions of interest. A time-harmonic magnetic field $B_1/\mu$ in a lossy, anisotropic, inhomogeneous coil-tissue system can be described by the differential form of the Maxwell-Ampere Law (10):

$$\nabla \times B_1/\mu = J_c + \partial D/\partial t \tag{32}$$

By Ohm's Law the current density $J_c = \sigma E$, and by Euler's Law the electric field displacement $\partial D/\partial t = \partial \epsilon E/\partial t = j\omega \epsilon E/\partial t = j\omega \epsilon E$ so that Eq. (32) can be rewritten as:

$$\nabla \times B_1/\mu = (\sigma + j\omega\epsilon)E \tag{33}$$

The complex value of E can be written in terms of the magnetic vector potential A, and the electric scalar potential $\phi$, such that:

$$\nabla X\, B_1/\mu = (\sigma + j\omega\epsilon)(-j\omega A - \nabla\phi) \tag{34}$$

Influencing the $B_1$ distribution and loss in human tissues adjacent to the coil are the $B_1$ field induced eddy current density, $J_e = -j\omega\sigma A$, and the accompanying electric field displacement current density, $J_d = -j\omega\epsilon E = \omega^2 \epsilon A$ for tissue specific values of $\sigma$ and $\epsilon$. The magnetic vector potential lines A, and the contours $B_1 = \nabla X A$ generated in a human head model by specified resonator element currents can be determined by solving numerically for A and $\phi$ in the equation:

$$\nabla X\, 1/\mu \nabla X\, A = (\sigma + j\omega\epsilon)(-j\omega A - \nabla\phi) \tag{35}$$

Figure 6:
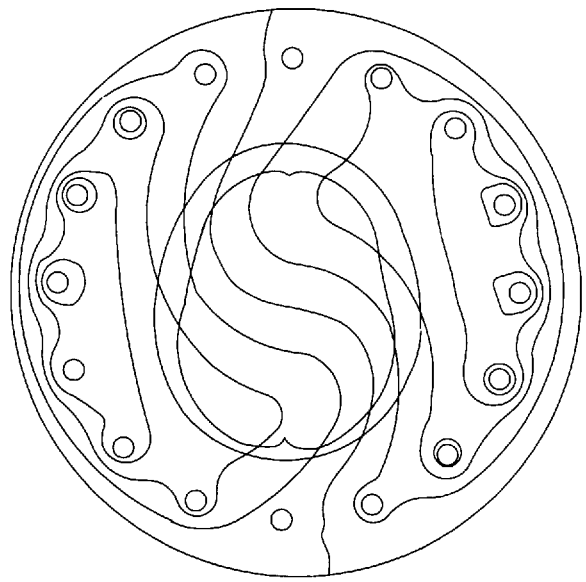
FIG. 6 shows time-dependent $B_1$ magnetic vector equipotentials for mode 1 of a head loaded coil according to the invention.

In FIG. 6, the Finite Element Method (FEM) is used to model a human head loaded 16 element TEM resonator operating at 175 MHz. The magnetic vector equipotential lines A/m, for mode M=1 of the TEM resonator were numerically solved by Eq. (35). The two layers of the head were traced from a 4.1 T MR image, and represent brain and scalp/fat/skull respectively. Table values for frequency dependent $\sigma$, $\epsilon$, and $\mu$ of human brain and skull/fat were assigned to the appropriate tissue layers of the model. The cross sectional view corresponding to the central transverse plane of the volume coil, is the Cartesian xy plane for the model with z being infinite. The coil's 16 RF current elements are contained within a cavity's usual grounded conductive cylinder. With equal RF current amplitude in the elements separated by phase $\phi = 2\pi/N$, a transverse electromagnetic (TEM) field is generated within the transmission line model as shown. Note the flux line rotations present in the high frequency coil-head model of FIG. 6, but not seen in the free space/static field representation of M=1 in FIG. 5.

Figure 7A:
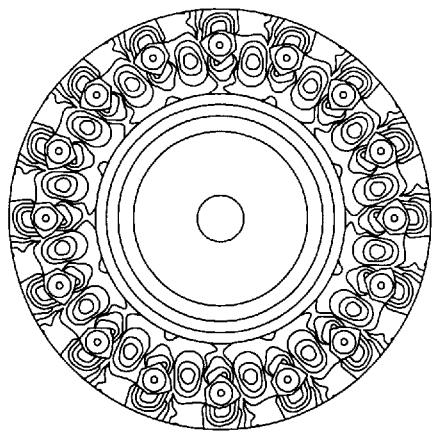
FIGS. 7*a, b* show time-dependent $B_1$ contours for mode 1 of the phantom and head loaded resonator according to the invention.
Figure 7B:
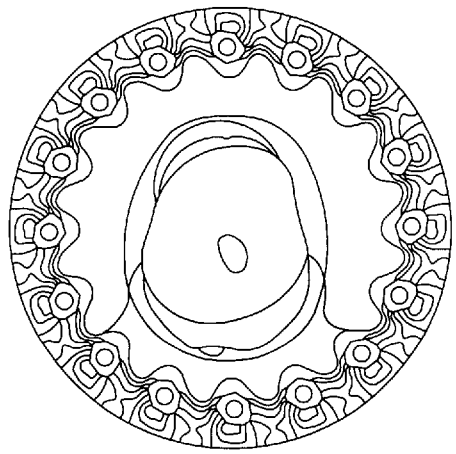

Calculated $B_1$ contours, T/m for phantom and head loaded TEM resonator models are shown in FIGS. 7a and 7b. Central to the current elements in FIG. 7a, is a 20 cm human head phantom identified by the contour pattern of five concentric circles. The phantom was assigned $\sigma$, $\epsilon$, and $\mu$ values of human brain. All space not occupied by the coil cylinder, elements or subject's head is free. With a 175 MHz, 2 ampere current assigned to the elements, a 10 $\mu$T $B_1$ field is generated in free space at the surface of the head phantom. At 175 MHz the head becomes a lossy dielectric resonator with a $B_1$ field distribution substantially different than that of free space. The model predicts an attenuation of the $B_1$ field by 3$\mu$T (30%) in the outside ⅓ radius of the phantom. This is the expected result of eddy current shielding. The model also predicts more than a 1$\mu$T (10%) $B_1$ field enhancement in the inside ⅒ radius of the head. This displacement current induced $B_1$ enhancement compensates for the increased shielding expected for higher frequencies such that $B_1$ homogeneity is adequate for imaging the human head and body in fields of 4 T and higher. FIG. 7b presents the FIG. 6 scale model of a head within a coil which is excited with current levels required for gradient echo imaging at 175 MHz. The model predicts $B_1$ contours of highest magnitude to be in the frontal and occipital regions of the head due to their close proximity to the coil elements. The more distant temporal regions are lower in $B_1$ magnitude. The center of the brain shows the displacement current $B_1$ enhancement characteristic of the fortuitous coincidence of tissue $\sigma/\epsilon$ and human head electrical dimensions at higher frequencies. Also beneficial is the eddy current retarding effect of the heterogeneity of human tissue and anatomical structure. The more heterogeneous two layer model in FIG. 2b predicts a $B_1$ inhomogeneity of less than ±10% magnitude variation over the head compared to ±15% variation over the single layer isotropic model of FIG. 2a. Empirical observations support the predictions from the coil-head, and coil-phantom models above (2, 4, 5, 13,14).

Figure 8A:
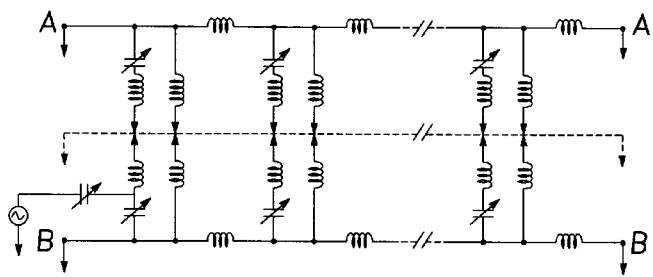
FIGS. 8*a, b* show alternative circuit models for a tuned TEM resonator according to the invention.
Figure 8B:
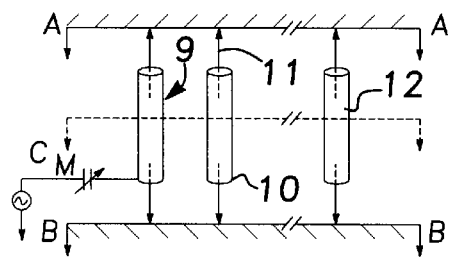

Alternative TEM resonator models: So far, transmission line theory was used to describe the tuned TEM resonator as a transmission line tuned coaxial cavity resonator. Alternatively, the TEM resonator can be approximated as a balanced comb-line, band-pass filter using the lumped element circuit of FIG. 8a. The lumped elements in this circuit approximate the distributed element coefficients of the transmission line circuit. Analysis of this lumped element filter circuit model adhering to methods in the literature for "bird-cage" resonators gives inaccurate results (15, 16). My invention's more accurate approach considers the lumped element filter's distributed stripline analogue in FIG. 8b. This network is a quarter wave (as in FIGS. 1a and 1c) comb-line filter interfaced with its mirrored image at the virtual ground plane of symmetry indicated by the dotted line. Each coaxial element, due to its split central conductor, therefore is a resonant half wave line (mirrored quarter wave pair, as in FIGS. 1b and 1c wave pair) whose bisected center conductor 11 is grounded at both ends to a cavity. The elements 9 are coupled via the TEM slow wave propagation in the cavity. The performance characteristics of this distributed structure are calculated from TEM assumptions (17).

Methods and Materials:

TEM resonator construction: Single and double tuned TEM resonators have been built for clinical MR applications from 70 to 175 MHz. Prototypes have been bench tested to 500 MHz. Thus, FIG. 9 shows a 175 MHz (4.1 T) head coil. Here the tuned TEM human head sized resonator measures 34 cm o.d. (cavity) by 27 cm i.d. (elements) by 22 cm in length. The i.d. and length were determined by head size while the o.d. was chosen for compactness with some sacrifice of the optimal coil Q predicted for a larger cavity Eq. (14). The cavity itself is constructed of 1 mil copper foil 13 fitted to the inside and outside surfaces of an acrylic cylinder Eq. (13). Acrylic end members support the reentrant tuning elements and the copper foil making their continuity with the cavity. The cavity could be extended with foil on plate 24.

N.B. A "transmission line element" need be no more than a pair, or more, of conductors side by side, and AC coupled to each other by a dielectric therebetween. It is evident, therefore, that "coaxial cable" is not the only form the "elements" or "segments" may take in the process of my invention.

The tuning elements are 21 cm coaxial line segments 9 whose outer member 31 is a copper conductor whose i.d. is 12.7 mm (0.5"), and whose center conductor 30 is a bisected 6.5 mm (0.25") o.d. copper rod. Teflon sleeve inserts (not shown) provide the dielectric between conductors 30 and 31, and are machined to serve as both a dielectric and bearing surface between the two conductors. The Teflon sleeve thickness ($b_e - a_e$) should be greater than 3 mm to preclude the possibility of dielectric breakdown and consequential arcing during high peak power transmitting. 5 mm Teflon spacers 15 at each end of the coax segment maintain electrical isolation between the outer conductor 11 of the element 9 and the cavity foil 13 to which the center conductor is attached. See FIGS. 1 and 2 of Röschman (3) for an exemplary element construction of this sort.

The element component diameters and the number of the tuning elements used are determined for a desired frequency and coil size by starting with Eq. (25) and working backwards solving for N, $a_e$, and $b_e$. Assuming the lossless case for the lines and the cavity simplifies the calculations required. Using 4N tuning elements in the design facilitates quadrature drive. Typical values for N are 12 to 16 in a human head coil and 24 to 32 in a human body coil. Homogeneity is proportional to N whereas frequency is inversely proportional.

The divided center conductors of the tuning elements are conductively connected to the cavity 1 on one end thereof by the collet clamps 32, and on the other end by copper beryllium spring gaskets, copper straps, or the like. The collet clamps allow for fixed adjustment of the insertion depths of the center conductor halves during coil fabrication. The gaskets allow for variable adjustment during coil operation. By varying the insertion depth of their center conductors, the coaxial line elements are tuned to a desired coincidence of mode and frequency.

Figure 10:
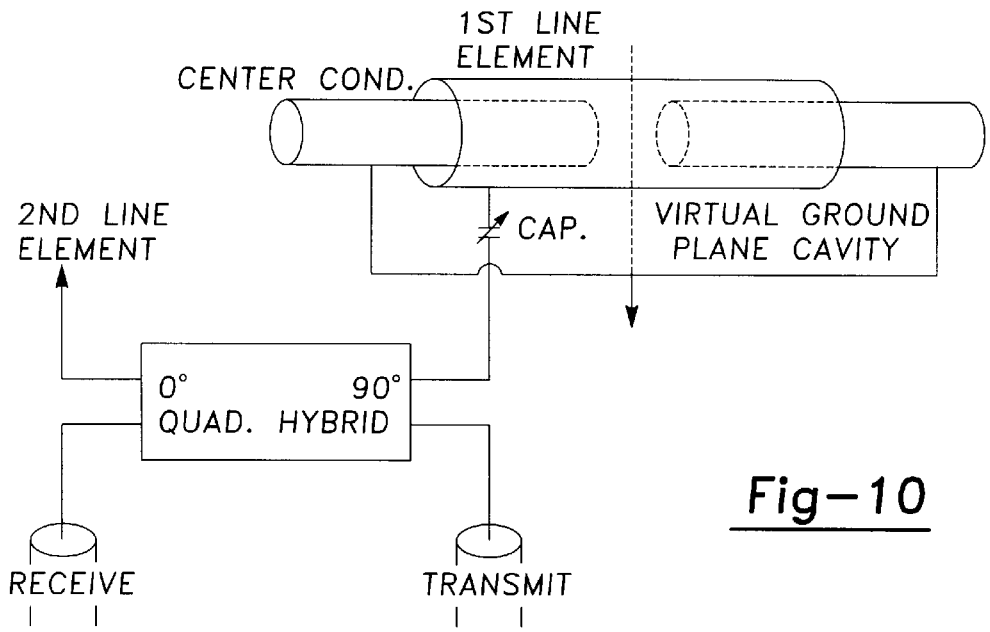
FIG. 10 is a circuit diagram of a driven coaxial line element used in the present invention.

As previously described, the center conductors on one end of the cavity are mechanically linked by a mobile plate and screw mechanism such that by turning a knob or knobs all can be adjusted in concert to tune the resonator without effecting its field symmetry. Two line elements 9 separated by a 90° azimuth angle are connected to a pair of 90° phased ports 21 of a strip line quadrature hybrid for quadrature drive of the TEM resonator. See FIG. 10 which shows one of two driven line elements for a quadrature excited resonator.

The hybrid ports are properly phased and impedance matched to the coil and its human head or body load via the reactance of variable reactors comprising variable series capacitance and/or balun circuits, not shown in FIG. 9, which, however, does show knobs 46 for varying said reactance. FIG. 12 requires an additional circuit of this sort, so knobs 47 would provide for varying reactance. The quadrature hybrids for frequencies A and B are identified by reference numerals 48 and 49. Reference numeral 50 identifies FIG. 9's quadrature hybrid.

Figure 11:
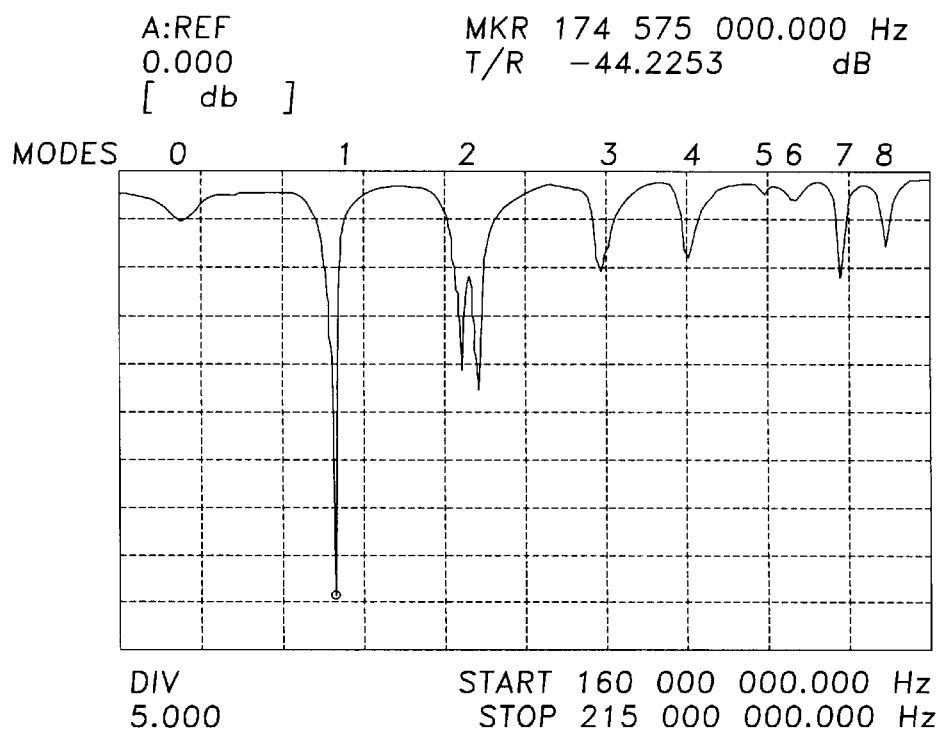
FIG. 11 is a diagram of transmission return loss showing resonances of a sixteen element resonator according to the invention.

TEM resonator optimization: Frequency tuning, impedance matching, quadrature phase isolation, $B_1$ homogeneity and sensitivity, and Q are among the more important performance characteristics to be optimized for any quadrature volume coil. After the TEM resonator is constructed, the first step toward optimization is to adjust all elements (2N half elements) to the equal capacitance values which tune the resonator's M=1 mode resonance to the design frequency. An RCL meter is used for element capacitance measurements. A network analyzer frequency swept reflection measurement is used to produce the return, loss plot identifying the 16 element head coil's 9 resonant modes in FIG. 11. Mode 1, located at 174.575 MHz will initially appear as a double resonance as mode 2 for the non optimized coil. By an iterative method of fine tuning the capacitances of individual elements (not unlike the tuning of a bicycle wheel through spoke adjustment), the mode 1 doublet will collapse into the well matched, high Q, single frequency point as shown. For the quadrature coil, the plot of FIG. 11 must be reproduced for mode 1 at each of the two drive points independently. Additionally, a transmission test should confirm better than 40 dB isolation between the quadrature drive points, at the design frequency. Maximum $B_1$ field amplitude should be verified on the axes orthogonal to the bisecting longitudinal planes of the coil containing the driven elements. $B_1$ transmission field magnitude and homogeneity are measured on the quadrature x and y axes with a directional magnetic field probe receiver. After the alignment of quadrature, well matched and isolated, high $B_1$ amplitude resonances at the mode 1 design frequency in the unloaded coil, the optimization process is repeated for the phantom loaded coil. The phantom electrically mimics a human head in volume and conductivity. The resonator is then fine tuned on human subjects. A stripline quadrature hybrid is finally connected to the two capacitively matched, quadrature drive points of the resonator. In the optimized coil, two superposed quadrature $B_1$ fields corresponding to the mode 1 frequency are measured, with peak amplitudes of 3 dB less gain than the previously measured single drive point linear fields. With all adjustments complete, the sliding center conductors of the coax segments are clamped into position at both the fixed ring and mobile plate ends of the coil. In the magnet, the resonator is tuned to different loads by turning the central knob 35 shown in FIG. 9, 46 are adjusted for precise impedance matching and 90° phase isolation between the two coil ports of the quadrature hybrid. Tune, match, and phase adjustments can readily be performed on each study.

Results:

Single and double tuned TEM resonators perform efficiently from 70 to 175 MHz in human head and body applications. The Q ratio of a 175 MHz tuned TEM head coil design is a high 840/90 typical of resonant cavities. The tuning range for this tuned cavity design is arbitrarily large to an octave or better. This range facilitates the use of a given coil at different field strengths and for different nuclei. For a whole human head, 90° optimization is typically achieved with a 1 kW, 250 $\mu$sec square pulse. For each MR study performed, the TEM resonator is tuned to frequency, matched to a VSWR of 1.0 at both coil drive points, and quadrature phase isolated to greater than 50 dB, all without adversely influencing $B_1$ field symmetry. This In Situ optimization requires three external adjustments and less than three minutes time.

$B_1$ field patterns observed in phantom and human loads are consistent with the model predictions of FIG. 7. Equal element currents correlate to maximum homogeneity of $B_1$ field distribution in axis symmetric phantoms coaxially located within the coil. Head images from resonators with equal element currents do not show the best achievable homogeneity. The $B_1$ contour pattern calculated for equal currents in FIG. 7 predicts the inhomogeneities in the head image of FIG. 12. $B_1$ coupling of the highest magnitude is in the occipital region of the head due to the head's close proximity to the coil elements. The intensity of $B_1$ coupling to the frontal region of the brain which is spaced further from the coil elements to allow for the nose, is less. The more distant temporal regions show the least signal intensity and corresponding $B_1$ field strength. The center of the brain shows the displacement current $B_1$ enhancement predicted. At high frequencies, a more homogeneous $B_1$ distribution in the head or other loads lacking perfect axial symmetry and position can be achieved by asymmetrically adjusting individual element currents while otherwise maintaining optimized performance characteristics for mode 1 of the coil. Element currents affecting higher homogeneity for a design and application can be calculated as before by numerically solving Maxwell's equations for finite-element scale models of the loaded coil. Homogeneity in the human head of 10% variation over a 15 cm d.s.v. has been achieved in practice, using a T1 weighted gradient echo sequence wherein TR=2500 ms, TE=17.5 ms, and TIR=1000 ms for a 3 mm, $512^2$ resolution single acquisition image. Only a relatively low level 400 W peak RF prefocussed pulse excitation wave form was required for head images. This is in contrast to the exceedingly high levels formerly predicted in the literature for high field clinical imaging. High resolution definition of the transcranial vascularity is thought to be enhanced by the high field susceptibility gradient imparted by the relative paramagnetism of deoxygenated hemoglobin in venous blood. 3 mm and 5 mm slice thickness brain images of $512^2$ and $1024^2$ resolution showing submillimeter detail of brain vasculature and neuroanatomy have been obtained (4, 18). Excellent quality human head and body images have been shown (19).

Using the tuned TEM resonator at 4.1 Tesla, the potential for scientific studies and clinical diagnostics from anatomic, spectroscopic, and functional imaging of the brain has been convincingly demonstrated. With 400 $\mu$M in plane resolution from 3 mm slices, clinically important structures such as the basal ganglia, red nuclei, thalami and the substantial nigra were clearly visualized in 20 volunteers, potentiating image based diagnoses of neurodegenerative disorders such as Parkinson's disease (20). In 8 healthy volunteers and 7 patients with temporal lobe epilepsy, the internal anatomy of the hippocampal formation was well defined. The alveus and fimbria were resolved from adjacent cellular layers; the stratum radiatum and lacunosum were resolved from the cornu ammonis. Atrophy, normal layer disruptions, and/or T1 and T2* deviations clearly indicated the affected hippocampus in all seven patients studied (21). High resolution spectroscopic images (0.5 cc voxels) from 10 healthy volunteers and 3 multiple sclerosis (MS) patients indicates the potential for using the spatial variability of NAA, creatine, choline, and lactate across MS plaques for the diagnosis and understanding of the disease (22). In high resolution NAA images of the whole brain, the loss of NAA from small stroke penumbra is dramatic (23). The high spatial and temporal resolution detection and quantification of the amino acids glutamate and glutamine are important for mechanistic studies and diagnoses of metabolic disorders such as hepatic encephalopathy (24). High resolution spectroscopic imaging studies of 10 human subjects have been used to quantify gray and white matter metabolites in the whole brain In-Vivo (25). The tuned TEM resonator has proven effective for the application of homogeneous, high resolution 3-D cerebral activation mapping (functional imaging) of the human brain at 175 MHz (26). The preceding results and those from studies in progress, demonstrate the effectiveness of the tuned TEM resonator design for high field clinical applications.

Human images and spectra obtained with an experimental 4.1 T MR system indicate the advantages gained by performing clinical studies at higher $B_0$ fields. These advantages of S/N, spatial resolution, temporal resolution, chemical shift resolution and the magnetic susceptibility enhancement of brain and other organ functions point to higher $B_0$ fields in clinical MR.

My new RF coil achieves those advantages, so it can replace coils of the present lumped element technologies which perform poorly for clinical sized volumes at higher frequencies. The distributed technology presented herein, making use of transmission lines and resonant cavities, perform well over the tested bandwidth of 70–175 MHz for human head and body coil applications. Beyond this, bench tested prototype single and double tuned large volume coils forecast successful use of the tuned TEM resonator at frequencies to 500 MHz for human volumes, and even higher for smaller volumes.

References:
1. H. J. Schneider, and P. Dullenkopf, Rev. Sci. Instrum. 48, 68 [1977].
2. H. Barfuss, H. Fischer, D. Hentschel, R. Ladebeck, A. Oppelt, R. Wittig, W. Duerr, and R. Oppelt, MR Biomed. 3, 31 [1990].
3. P. K. Röschmann, U.S. Pat. No. 4,746,866 [1988].
4. J. T. Vaughan, J. O. Otu, H. P. Hetherington, P. Noa, G. M. Pohost, in "Book of Abstracts, Society of Magnetic Resonance in Medicine, 11th Annual Meeting, Berlin, 1992," p. 279.
5. J. T. Vaughan, H. P. Hetherington, J. G. Harrison, J. O. Otu, J. W. Pan, P. J. Noa, G. M. Pohost, Phys. Med. [1993].
6. J. T. Vaughan, H. P. Hetherington, J. W. Pan, P. J. Noa, G. M. Pohost, in "Book of Abstracts, Society of Magnetic Resonance in Medicine, 12th Annual Meeting, New York, 1993".
7. R. A. Chipman, "Theory and Problems of Transmission Lines", McGraw-Hill, New York, 1968.
8. S. Y. Liao, "Microwave Devices and Circuits", Prentice-Hall, Englewood Cliffs, New Jersey, 1985.
9. R. Chatterjee, "Elements of Microwave Engineering," Ellis Horwood, Chichester, England, 1986.
10. R. F. Harrington, "Time-Harmonic Electromagnetic Fields," McGraw-Hill, New York, 1961.
11. Maxwell® Engineering Software System, Ansoft Corporation, Pittsburgh, 1992.
12. F. A. Duck, "Physical Properties of Tissue", Academic Press, London, 1990.
13. H. Bomsdorf, T. Helzel, D. Kunz, P. Röschmann, O. Tschendel, and J. Wieland, MR Biomed. 1, 151 [1988].
14. J. T. Vaughan, J. Harrison, B. LW. Chapman, J. W. Pan, H. P. Hetherington, J. Vermeulen, W. T. Evanochko, G. M. Pohost, in "Book of Abstracts, Society of Magnetic Resonance in Medicine, 10th Annual Meeting, San Francisco, 1992," p. 1114.
15. J. Tropp, J. Magn. Res. 82, 51 [1989].
16. R. Pascone, T. Vullo, J. Farrelly, P. T. Cahill, Magn. Reson. Imag. 10, 401 [1992].
17. G. L. Matthaei, L. Young, E. M. T. Jones, "Microwave Filters, Impedance Matching Networks, and Coupling Structures," McGraw-Hill, New York, 1964.
18. H. P. Hetherington, J. T. Vaughan, J. W. Pan, P. J. Noa, D. B. Twieg, R. K. Kuzniecky, G. M. Pohost, J. Magn. Reson. Imag. 3(P), 313 [1993].
19. J. T. Vaughan, J. Harrison, H. P. Hetherington, G. M. Pohost, J. Magn. Reson. Imag. 3(P), 314 [1993].
20. J. W. Pan, H. P. Hetherington, J. T. Vaughan, and G. M. Pohost, in "Book of Abstracts, Society of Magnetic Resonance in Medicine, 12th Annual Meeting, New York, 1993".
21. R. Kuzniecky, H. Hetherington, J. W. Pan, and G. M. Pohost, in "Book of Abstracts, Society of Magnetic Resonance in Medicine, 12th Annual Meeting, New York, 1993".
22. J. W. Pan, H. P. Hetherington, G. F. Mason, J. N. Whitaker, and G. M. Pohost, in "Book of Abstracts, Society of Magnetic Resonance in Medicine, 12th Annual Meeting, New York, 1993".
23. H. P. Hetherington, J. W. Pan, G. F. Mason, S. L. Ponder, D. B. Twieg, J. T. Vaughan, and G. M. Pohost, in "Book of Abstracts, Society of Magnetic Resonance in Medicine, 12th Annual Meeting, New York, 1993".
24. G. F. Mason, J. W. Pan, H. P. Hetherington, S. Ponder, D. Twieg, and G. Pohost, in "Book of Abstracts, Society of Magnetic Resonance in Medicine, 12th Annual Meeting, New York, 1993".
25. H. P. Hetherington, J. W. Pan, G. F. Mason, S. L. Ponder, D. B. Twieg, J. T. Vaughan, and G.M. Pohost, in "Book of Abstracts, Society of Magnetic Resonance in Medicine, 12th Annual Meeting, New York, 1993".

26. D. B. Twieg, J. W. van der Veen, R. K. Justice, J. den Hollander, H. P. Hetherington, J. T. Vaughan, G. Deutsch, and G. M. Pohost in "Book of Abstracts, Society of Magnetic Resonance in Medicine, 12th Annual Meeting, New York, 1993".

27. P. K. Röschmann et al., U.S. Pat. No. 4,712,067 (1987).

28. Kemmer et al, U.S. Pat. No. 4,737,718. 1988.

29. Mens et al, 4,952,878, 1990.

What is claimed is:

1. An electromagnetic shield for an NMR radio frequency coil and means for generating a resonant magnetic field in said coil at a selected Larmor frequency, said shield comprising:

an electrically conductive layer surrounding the coil, said conductive layer having a thickness sufficient to conduct radio frequency currents and contain radio frequency fields at the selected Larmor frequency and simultaneously attenuate low frequency eddy current propogation of the type induced by switching field gradient currents in an NMR application.

2. The invention as defined in claim 1 wherein said conductive layer comprises a metallic foil.

3. The invention as defined in claim 1 wherein said conductive layer has a continuous surface.

4. The invention as defined in claim 1 wherein said layer has a thickness substantially equal to one skin depth at said selected Larmor frequency.

5. The invention as defined in claim 1 wherein said conductive layer comprises a deposited metallic layer.

6. The invention as defined in claim 1 wherein said conductive layer comprises a plated metal layer.

* * * * *

UNITED STATES PATENT AND TRADEMARK OFFICE
CERTIFICATE OF CORRECTION

PATENT NO.   : 5,886,596
DATED        : March 23, 1999
INVENTOR(S)  : John Thomas Vaughan, Jr.

It is certified that error appears in the above-identified patent and that said Letters Patent is hereby corrected as shown below:

Column 6,
Line 62, replace "3b" with -- 3a --.

Column 8,
Line 59, replace "y=fo($\lambda$/$\tau$)" with -- y=f($\lambda$o/$\tau$) --.

Column 10,
Line 53, insert -- 30 -- after "coductors".

Column 11,
Line 4, replace "27" with -- 26 --.
Line 57, replace "40" with -- 36 --.

Column 14,
Line 39, replace "13" with -- 23 --.

Column 15,
Line 9, replace "1" with -- 21 --.
Line 22, replace "effecting" with -- affecting --.

Column 16,
Line 41, replace "Figure 7" with -- Figure 6 --.
Line 42, replace "Figure 12" with -- Figure 7b --.

Signed and Sealed this

Nineteenth Day of March, 2002

Attest:

JAMES E. ROGAN
*Director of the United States Patent and Trademark Office*

*Attesting Officer*

UNITED STATES PATENT AND TRADEMARK OFFICE
CERTIFICATE OF CORRECTION

| | | |
|---|---|---|
| PATENT NO. | : 5,886,596 | Page 1 of 1 |
| APPLICATION NO. | : 08/710365 | |
| DATED | : March 23, 1999 | |
| INVENTOR(S) | : John Thomas Vaughan, Jr. | |

It is certified that error appears in the above-identified patent and that said Letters Patent is hereby corrected as shown below:

In the Specifications:

Column 1,
Line 2, please insert following "RADIO FREQUENCY VOLUME COILS FOR IMAGING AND SPECTROSCOPY"

-- GRANT REFERENCE
This invention was made with government support under NCRR-RR07723, awarded by the National Institutes of Health. The government has certain rights in the invention. --

Signed and Sealed this
Seventh Day of May, 2013

Teresa Stanek Rea
*Acting Director of the United States Patent and Trademark Office*